United States Patent [19]

Hayner

[11] Patent Number: 4,506,221

[45] Date of Patent: Mar. 19, 1985

[54] MAGNETIC HEADING TRANSDUCER HAVING DUAL-AXIS MAGNETOMETER WITH ELECTROMAGNET MOUNTED TO PERMIT PIVOTAL VIBRATION THEREOF

[75] Inventor: Paul F. Hayner, Swampscott, Mass.

[73] Assignee: Sanders Associates, Inc., Nashua, N.H.

[21] Appl. No.: 392,858

[22] Filed: Jun. 28, 1982

[51] Int. Cl.³ .......................................... G01R 33/02
[52] U.S. Cl. .................................. 324/256; 73/517 R
[58] Field of Search ................... 324/256, 257, 259; 33/361; 73/517 R, 517 AV, 649, 650, 652, 654; 367/180, 182, 185

[56] References Cited

U.S. PATENT DOCUMENTS

| | | |
|---|---|---|
| 2,880,333 | 3/1959 | Dranetz . |
| 2,963,911 | 12/1960 | Courtney-Pratt et al. . |
| 2,984,111 | 5/1961 | Kritz . |
| 3,264,554 | 8/1966 | Hayner et al. . |
| 3,283,590 | 11/1966 | Shang . |
| 3,803,546 | 4/1974 | Leon . |
| 4,053,829 | 10/1977 | Maruo . |
| 4,306,456 | 12/1981 | Maerfeld .......................... 73/517 R |

FOREIGN PATENT DOCUMENTS 857459 12/1960 United Kingdom ................ 324/256

OTHER PUBLICATIONS

Moore, David William, "Electronic Position Pickup," *Electronics*, Jan. 1947, pp. 100, 101.

*Primary Examiner*—Gerard R..Strecker
*Attorney, Agent, or Firm*—Louis Etlinger; Richard I. Seligman

[57] ABSTRACT

A dual-axis magnetometer employs an electromagnet mounted by bender arms within a housing to permit pivotal vibration of the electromagnet with respect to the housing. The electromagnet is driven by an alternating current that causes it to vibrate in the presence of an external magnetic field having a component in a plane perpendicular to the axis of the electromagnet. Output signals are provided at conductors on opposite surfaces of the benders. By observing the relative magnitudes of the output signals and the relationships of their phases with that of the excitation signal, it is possible to determine the direction of that component of the external magnetic field that lies in a plane perpendicular to the electromagnet axis.

7 Claims, 4 Drawing Figures

MAGNETIC HEADING TRANSDUCER HAVING DUAL-AXIS MAGNETOMETER WITH ELECTROMAGNET MOUNTED TO PERMIT PIVOTAL VIBRATION THEREOF

BACKGROUND OF THE INVENTION

The present invention is directed to dual-axis magnetometers. It finds particular application where miniaturization is desired.

Numerous applications require accurate determination of the orientation of an object with respect to a magnetic field. The magnetic field of the earth is often of interest, for example, both in navigation and in other applications requiring orientation sensing.

An example of an application in which the magnetic field of the earth is sensed in order to determine orientation is the use of a magnetometer to detect the orientation of an acoustic array that is deployed in the ocean in order to form precise acoustical beam patterns. In this type of application, dual-axis magnetometers can be employed. Specifically, if the direction and inclination of the earth's magnetic field at the location of the array are known, it is possible to determine the orientation of the array, and the directions of the beams formed by it, through the use of two orthogonally oriented dual-axis magnetometers that provide the orientation of the array relative to the earth's field. Alternatively, a gravitational sensor can be used in conjunction with a single dual-axis magnetometer to determine orientation.

Dual-axis magnetometers have been realized in the past by employing flux gates. However, employment of the flux gate in orientation sensors of the type described above has certain disadvantages. While relatively small flux gates have been described in the literature, those commercially available tend to be rather large. Furthermore, they present design problems because of their sensitivity to temperature. In addition, there is a tendency for them to interfere with other magnetic instrumentation. In sensing of acoustic-array orientation, on the other hand, it is important that the orientation sensor be small so as to minimize flow noise during towing of the arrays, and it is desirable that the device be simple and inexpensive to manufacture so that it can be used with expendable acoustic-array systems.

It is accordingly an object of the present invention to provide dual-axis magnetic direction sensing in a device that lends itself to miniaturization and provides sensitive direction detection with a minimum of sensitivity to temperature variation.

SUMMARY OF THE INVENTION

The foregoing and related objects are achieved in a dual-axis magnetometer that includes an electromagnet that is mounted in such a manner that it is allowed to move pivotally. An alternating current is caused to flow in the electromagnet, and the interaction of the resultant magnetic field with the earth's magnetic field causes the electromagnet to vibrate pivotally. The direction of the vibration is an indication of the direction of that component of the earth's magnetic field that lies in a plane perpendicular to the rest axis of the electromagnet.

At least two transducers for measuring the pivotal vibration are attached to the electromagnet, and each generates a signal that is proportional to the component of vibration in a plane passing through the electromagnet axis and the axis of that transducer. Comparison of the signals generated by the transducers indicates the direction of vibration of the electromagnet. The direction of vibration is in turn the direction of that component of the earth's magnetic field that lies in a plane perpendicular to the rest axis of the electromagnet. If the direction of the earth's magnetic field at the geographic position of the magnetometer is known, the orientation of the magnetometer can thus be determined if its angle with the vertical is also known.

BRIEF DESCRIPTION OF THE DRAWINGS

These and further features and advantages of the present invention are described in connection with the accompanying drawings, in which.

DETAILED DESCRIPTION OF THE PREFERRED EMBODIMENT

Figure 1:
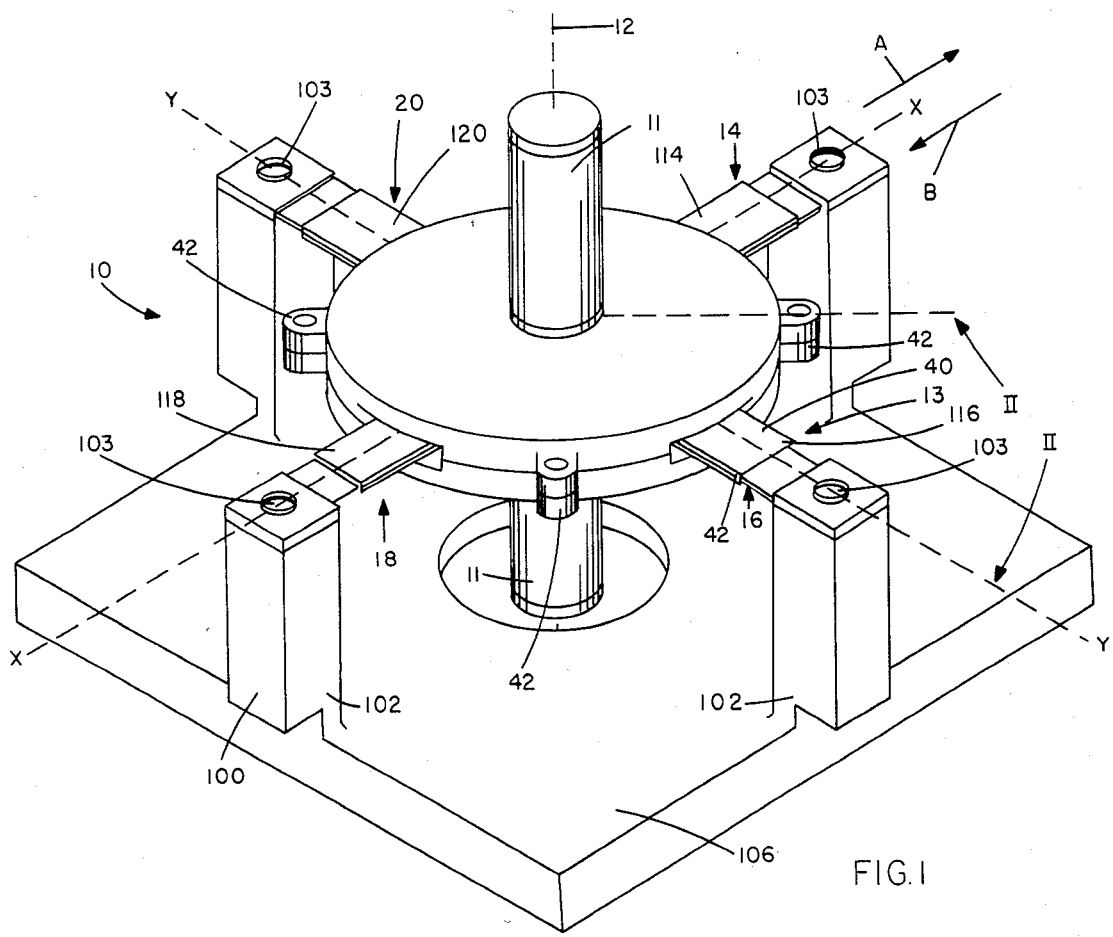
FIG. 1 is a conceptual perspective view of the electromagnet and transducers employed in the illustrated embodiment of the present invention.
Figure 2:
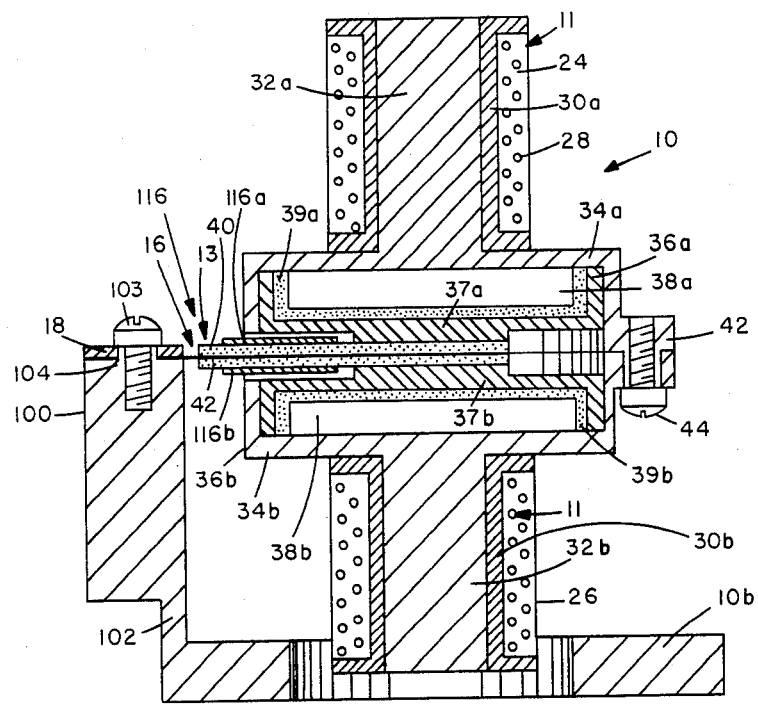
FIG. 2 is a vertical cutaway elevation of the preferred embodiment of the present invention from FIG. 1 in the folded plane II—II.

The drawings illustrate a dual-axis magnetometer for determining the direction of that component of an external magnetic field that is parallel to a reference plane stationary with respect to the magnetometer. With reference first to FIGS. 1 and 2, the magnetometer 10 includes an electromagnet 11 having a magnetic axis 12. It also includes a transducer unit 13 comprising orthogonal pairs of radial flexure arms 14, 16, 18, and 20 supporting the electromagnet by means of posts 100 and leaf springs 102 that extend vertically from a base 106 which is ordinarily mounted on an object whose orientation is to be determined. Screws 103 through holes 104 provided therefor are used to fasten flexure arms 14, 16, 18 and 20 to posts 100. The flexure arms are relatively stiff and serve to urge electromagnet 11 to the rest position shown in FIG. 1, but they bend enough to permit limited pivotal vibration of electromagnet 11 with respect to base 106. At the outer ends of arms 14-20 are transducers 114-120 defined by electrodes 114a/b-120a/b on the upper and lower surfaces of the arms, respectively, which will be recognized by those skilled in the art as bimorphs. Each transducer 114-120 generates a potential difference of one polarity across its electrode 114a/b-120a/b when its arm flexes in one direction. It generates a potential difference of the opposite polarity when its arm flexes in the other direction.

In operation, an alternating excitation signal is applied to the windings of electromagnet 11 to cause an alternating magnetic field along its axis 12. If there is an external magnetic field, such as that of the earth, that is not parallel to axis 12, electromagnet 11 will experience an alternating torque that causes it to vibrate pivotally in the direction of the magnetic field.

More specifically, electromagnet 11 responds to the external magnetic-field component normal to its rest axis by vibrating in the plane defined by its rest axis and the magnetic-field vector, and arms 14-20 vibrate flexurally in proportion to the components of magnet vibration parallel to their respective axes, herein designated the x and y axes. The transducers 114–120 are flexed by the vibration and generate signals whose amplitudes are proportional to the vibrational amplitudes of the respective flexure arms and thus proportional to the amplitudes of the magnet 12 vibration components in the planes of their associated flexure arms. The signals from the transducers on arms 14 and 16 are opposite in polarity to those from the transducers on arms 18 and 20, respectively, because opposed arms flex in opposite directions in response to pivotal vibrations of the magnet 12. Therefore, as will be described below, the output of transducer 114 is subtracted from the output of transducer 118, and the output of transducer 116 is subtracted from the output of transducer 120 to provide a pair of component signals.

By comparing the magnitudes of the component signals from the two pairs of opposed transducers, it is possible to determine the direction of the projection of the external magnetic field into a reference plane perpendicular to the rest axis of the electromagnet 12, e.g., the plane of base 106. More specifically, if the electromagnet assembly is vibrating exclusively in the direction of arms 14 and 18, the only signals produced would be those from the transducers 114 and 118. The signal obtained by the subtraction of the signals from transducers 114 and 118 will bear one of two possible phase relationships to the magnet drive current. The two possible phases differ from each other by 180 degrees, and it is convenient to assign a sign to the signal magnitude to represent which of the two possible phase relationships it exhibits. This phase relationship indicates the field direction. For example, if a positive signed magnitude indicates a field in the direction of arrow A, a negative signed magnitude indicates a field in the direction of arrow B.

The direction can be similarly deduced if signals are produced only by the transducers on arms 16 and 20 and not by those on arms 14 and 18.

If both pairs of transducers generate output signals, indicating that the magnetic-field direction lies between the axes, the direction can be determined from the ratio of the signals from the two pairs. Assuming that the transducers all have the same sensitivity, the direction of the magnetic field will be the inverse tangent of the ratio of the signed magnitudes of the component signals from the two pairs of transducers.

If the reference plane of the magnetometer is horizontal, the sensor outputs will reflect a pair of horizontal components of the earth's magnetic field. The trigonometric conversion described above will then provide the azimuthal bearing of the magnetometer with respect to the field. On the other hand, if the reference plane is tilted, the magnetometer will respond also to the vertical component of the earth's field, and its response to the horizontal components will vary with the tilt angle. The resulting ambiguity can be resolved by using two magnetometers whose magnetic axes are at an angle with each other. The signals from the two magnetometers will, with trigonometric conversions, provide the desired azimuthal bearing of the object on which the magnetometers are mounted. Alternatively, one can use a single magnetometer in conjunction with a device, such as a gravitometer, that provides signals corresponding to the tilt angle of the magnetometer. Again, the application of appropriate trigonometric conversions to the gravitometer and magnetometer signals will provide the azimuthal bearing.

The type of magnetometer described here is well adapted to miniaturization. Samples have been constructed that fit in housings 1.9 cm (0.75 in.) long and 1.8 cm (0.7 in.) in diameter. This compares favorably with the sizes of commercially available flux gates, which are used in similar applications. As compared with flux gates, the magnetometer is also less likely to cause magnetic interference. Furthermore, because of its AC operation, it is not plagued with the drift and temperature-stability problems that are often associated with flux gates. Finally, the illustrated embodiment of the magnetometer, which uses pairs of opposed transducers, is relatively insensitive to axial acceleration because the resultant signals from the opposed transducers cancel each other out.

Figure 3:
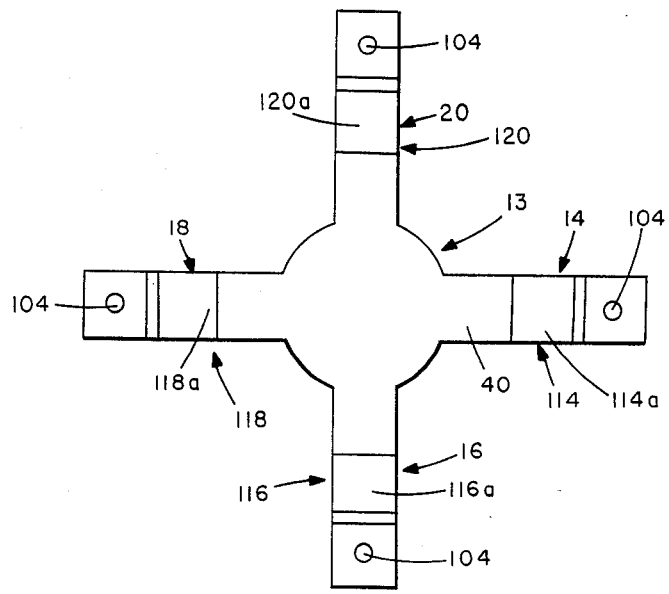
FIG. 3 is a plan sectional view of the transducer unit employed in the preferred embodiment.

For a more detailed description of a magnetometer embodying the invention, simultaneous reference will be made in the following discussion to FIGS. 2 and 3.

Arms 14, 16, 18, and 20 are bilaminate piezoelectric benders (i.e., bimorphs) formed as a single-piece cruciform transducer unit 13. These benders are of the type having two polarized layers, the layers being polarized in directions normal to the upper and lower arm surfaces and thus parallel to the electromagnet axis 12 in FIG. 1. The layer 40 facing upward in FIG. 2 is polarized in one direction, while the lower layer 42 is polarized oppositely. By locating electrodes 114a/b–120a/b on the upper and lower surfaces of these arms, bimorph transducers are provided that generate output signals when the arms are flexed in a direction substantially normal to their surfaces, e.g., parallel to the magnet axis 12.

Connections (not shown) provide signal paths between the transducers 114–120 and preamplifiers (to be discussed shortly). The signals are thus amplified, and various other operations may also be performed on them, as will be discussed below. The resultant signals are then transmitted out of the housing by means of electrical connections not shown in the drawings.

As was discussed above, the transducers 114–120 in the preferred embodiment are provided in pairs of associated transducers; the transducer 114 on arm 14 is associated with that 118 on arm 18, and these arms 14 and 18 are colinear. A similar relationship obtains between the transducers 116, 120 on arms 16 and 20.

When this type of organization is employed, the signals from transducers of the same pair are equal in magnitude and opposite in polarity, and the signal subtraction described above effectively doubles the response to axial flexure caused by vibration of the electromagnet. For instance, if the electromagnet 11 is tilted to the right in FIG. 1 in the plane shared by rest axis 12 and the axes of arms 14 and 18, arm 14 will be deflected downward, and arm 18 will be deflected upward. The result is that the polarities of their signals will be opposite, so their magnitudes will be added if the signals are subtracted.

On the other hand, no substantial signal will be generated by the transducers on arms 16 and 20 in response to such vibration. Arms 16 and 20 will undergo torsional deflection and will thus have essentially zero output voltages. Furthermore, any signal that might nevertheless be generated by one of the transducers on arms 16 and 20 will be of the same polarity as that generated by its associated transducers, and the subtraction will substantially eliminate the signal.

FIG. 2 shows that electromagnet 11 includes upper and lower parts 24 and 26. Part 24 includes the upper portion of an electrical winding 28 disposed about a spool 30a having a central aperture in which a core portion 32a of ferromagnetic material is located. Core portion 32a widens into a cup portion 34a at its lower end. Preferably, winding 28 is mounted on core portion 32a as shown.

Nested inside cup portion 34a is a cup 36a oriented in opposed relationship to the cup-shaped portion 34a and having a downwardly extending neck 37a. The cup 36a provides an interior cavity in which a pair of integrated-circuit preamplifiers 38a are disposed. Insulating material 39a is disposed between cup 36a and amplifiers 38a to protect the amplifiers. Preamplifiers 38a are located near the output transducers 114, and 118 (shown in FIG. 1) and within cups 34a and 36a so that preamplifiers 38a will be near the transducers 114, 118 and be exposed to essentially zero magnetic field. The above factors are important for reducing output null levels 40 db below torque and signal levels produced by the earth's horizontal field at high latitudes. The lower portion 26 of electromagnet 11 has the same construction as the upper portion 24. It includes the lower portion of the winding 28, which is disposed about a spool 30b that encloses a core section 32b. The core section 32b widens into a cup portion 34b at its upper end, and a cup 36b is disposed in the cup portion 34b as shown. A second pair of preamplifiers 38b are located inside cup 36b and connected to transducers 116, 120. The cup 36b has an upwardly extending neck 37b opposed to the neck 37a of cup 36a. The central hub of transducer unit 13 is disposed between the necks 37a and 37b.

More specifically, the portions 34a and 34b of the core section 32a and 32b are provided with tabs 42 extending radially outward from their main bodies between the angular positions of the transducers. These tabs are fastened together by screws 44. Tightening of these screws also serves to clamp the cruciform element central hub portion of unit 13 between the necks 37a and 37b. The transducer inner ends are thus mechanically connected to the core of the electromagnet 11 and constrained to vibrate with the electromagnet when it undergoes vibration due to the interaction of its alternating magnetic field with an external magnetic field.

FIG. 2 reveals that portions 24 and 26 of the electromagnet assembly engage the transducer unit 13 only via necks 37a, 37b in the central hub area; elsewhere they are spaced from the arms 14-20 to facilitate flexure thereof.

Given the magnetometer described above, those skilled in the art will recognize that there is a wide variety of devices for processing the signals from the magnetometer to produce an indication of the direction of the detected magnetic-field component. Accordingly, the diagram of FIG. 4 is presented only to show an exemplary connection of the magnetometer to such a device, not to describe one in detail.

Figure 4:
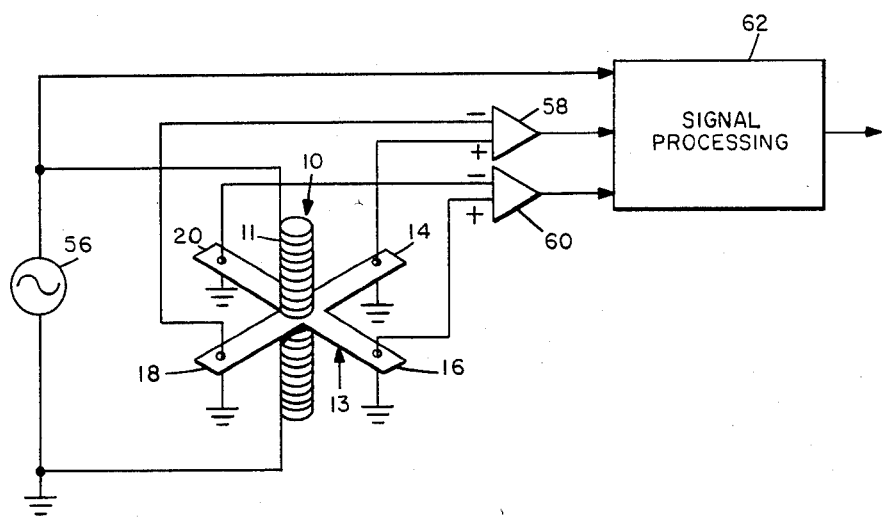
FIG. 4 is a simplified schematic diagram showing the magnetometer of the present invention connected to appropriate signal-processing circuitry.

FIG. 4 shows an excitation-signal source 56 connected to the winding of electromagnet 11 to drive it with an alternating current. In the exemplary arrangement, the lower transducer electrodes 114b-120b are all shown to be grounded, and the upper electrodes 114a-120a are shown connected to the input terminals of difference amplifiers 58, 60. Other connections are also possible, the preferred configuration depending in many cases on what is the most convenient physical arrangement of the connecting conductors.

The upper electrodes 114a, 118a on arms 14 and 18 are connected in the example to the same difference amplifier 58, while those 116a, 120a on arms 16 and 20 provide inputs to a second difference amplifier 60. The preamplifiers 38a and 38b in FIG. 2 may perform the functions of these amplifiers 58 and 60, which subtract signals from associated transducers.

The outputs of the difference amplifiers 58, 60 are fed to signal-processing circuitry 62, which compares their magnitudes. In order to locate the direction of the external field in the proper quadrant of the sensor's coordinate system, circuitry 62 must also receive phase information from excitation source 56. Although the diagram suggests that the signal received from excitation source 56 is indicative of the voltage applied to electromagnet 12, phase-shift considerations in many cases will necessitate the use of a signal representative of current. Regardless of the type of signal employed, resort to a phase relationship is necessary in the absence of a priori knowledge of the proper quadrant.

The signal-processing circuitry 62 may be of any type known for determining the angle that is the inverse tangent of the ratio of the magnitudes of the amplifier outputs. Analog-to-digital converters and a microprocessor can be used to perform the task digitally. Alternatively, the amplifier outputs can be used to drive the horizontal and vertical amplifiers of an oscilloscope. In such an arrangement, the excitation signal would be used to drive the intensity port and thereby suppress the display of alternate half cycles. Those skilled in the art will recognize that there are numerous other arrangements for finding the inverse tangent, and the signal-processing circuitry 62 of FIG. 4 may be any one of these.

The frequency at which the electromagnet 11 is driven will depend on a number of design factors. It may be desired, for instance, to keep the frequency of excitation well below the resonant frequency of vibration of the electromagnet assembly so that the vibration of the electromagnet assembly will be substantially in phase with the excitation current. On the other hand, the power of the transducer output increases with frequency, so it is important that the frequency of excitation be high enough to provide a sufficiently large output signal from the transducer. Furthermore, certain expected noise sources contribute noise predominantly at lower frequencies, and it is desirable to be able to filter out such frequencies without attenuating the signals produced by the vibration at the excitation frequency. Accordingly, a compromise will usually be made in determining the excitation frequency, which may be around 500 Hz in some miniaturized versions.

Among the source of noise that are the targets of high-pass filtering is acceleration of the magnetometer. Acceleration noise largely falls below the excitation frequency and so can be filtered out. Furthermore, the acceleration experienced by the magnetometer is much more often translational than rotational, so the resulting flexure of associated arms is usualy in the same direction, and the resultant signals are therefore canceled out due to the subtraction process.

It was mentioned above that the bilaminate benders (bimorphs) are so configured that the transducers produce no substantial signals as a result of torsional vibration. Any vestigial signals that do result from torsional vibration can be attenuated if a band-pass filter centered on the excitation frequency is substituted for the high-pass filter, because the bulk of the frequency content of any such signals would likely be limited to second and higher harmonics of the excitation frequency.

Those skilled in the art will recognize from the foregoing discussion that it is not necessary to employ the specific arrangement illustrated in the drawings in order to practice the invention. In particular, it is not necessary that the transducers be provided in pairs of opposed transducers. The direction information may be obtained by employing only two transducers. Moreover, it is possible in principle to obtain the information from transducers that detect components in planes that are not at right angles to each other. It is only necessary that the components of vibration sensed by the transducers lie in planes that are not coincident. However, the arrangement described herein is preferable because the use of four transducers allows the magnitudes of the signals of interest to be added and allows any contribution to the signal resulting from torsion to be subtracted. Furthermore, spurious signals resulting from translational acceleration of the magnetometer can also be eliminated by the signal subtraction.

It is also not necessary for piezoelectric benders to be used for the arms. The arms can be made of any material having the necessary stiffness and resilience. Strain gauges on non-piezoelectric arms can be used as the sensors. In fact, the arms themselves are not absolutely necessary so long as some means is provided for urging the electromagnet to its rest position. Many other variations that fall within the scope of the invention will be apparent to those skilled in the art in light of the foregoing description.

What is claimed as new and desired to be secured by Letters Patent of the United States is:

1. A dual-axis magnetometer comprising:
(a) a base plate;
(b) two pairs of opposed support posts disposed normal to the surface of said base plate and aligned along orthogonal X,Y axes, said posts being attached to said base plate by means for allowing resilient flexure along the one of said axes upon which each of said posts is disposed;
(c) a cruciform transducer assembly having a central hub and two pairs of orthogonal arms attached at their outward ends to the tops of respective ones of said posts and adapted for flexural movement, said arms each being a bimorph generating an electrical signal when flexed and including electrode means for outputting said signal;
(d) an electromagnetic coil carried by said transducer assembly disposed normal to said transducer assembly concentric with said hub and having equal portions above and below said hub; and,
(e) excitation means connected to said coil for exciting said coil with an ac electrical signal whereby said coil is caused to vibrate and said arms are made to flex and create output signals at said electrode means as a result of the combined magnetic fields of said coil and the earth at the location of the magnetometer.

2. The magnetometer of claim 1 wherein:
(a) said coil is in two parts with each wound about one of a pair of ferromagnetic cores each having a cup-shaped portion adjacent to and facing said hub;
(b) each of said cup-shaped portions has a ferromagnetic cup disposed in facing concentric relationship thereto to form a magnetically shielded space;
(c) said cores are clamped together with said hub held between said cups; and additionally comprising,
(d) amplifier means for receiving said signals and providing an amplified version thereof at outputs thereof disposed within said spaces and operatively connected to said electrode means to receive said signals at inputs thereof.

3. The magnetometer of claim 2 wherein:
said cups each have necks extending therefrom to contact said hub to space said coils away from said arms except at a point of contact at the central portion of said hub whereby said arms have a maximum length in which to flex freely.

4. The magnetometer of claim 2 wherein:
said amplifier means comprises a pair of differential amplifiers having said electrode means of opposed pairs of said arms connected to the inputs of respective ones of said amplifiers whereby the outputs of said amplifiers represent the difference signals from each of said opposed pairs.

5. A dual-axis magnetometer comprising:
(a) a cruciform transducer assembly having a central hub and four equal length arms extending radially outward from said hub in a common plane at 90° intervals, said arms each being resiliently flexible and a bimorph for generating an electrical signal when flexed and including electrode means for outputting said signal;
(b) support means for supporting said arms by their ends for flexural movement;
(c) a pair of ferromagnetic cores each having a cup-shaped portion on one end;
(d) a pair of ferromagnetic cups disposed in concentric facing relationship to respective ones of said cup-shaped portions to form a pair of magnetically shielded spaces, said cores and cups being concentrically aligned on opposite sides of said hub with said hub clamped between said cups whereby said cores are disposed perpendicular to the center of said hub on either side thereof;
(e) a coil wound equally on said cores;
(f) means for exciting said coil with an ac electrical signal whereby said coil is caused to vibrate and said arms are made to flex and create output signals at said electrode means as a result of the combined magnetic fields of said coil and the earth at the location of the magnetometer; and,
(g) amplifier means for receiving said signals and providing an amplified version thereof at outputs thereof disposed within said spaces and operatively connected to said electrode means to receive said signals at inputs thereof.

6. The magnetometer of claim 5 wherein:
said cups each have necks extending therefrom to contact said hub to space said coils away from said arms except at the point of contact at the central portion of said hub whereby said arms have a maximum length in which to flex freely.

7. The magnetometer of claim 5 wherein:
said amplifier means comprises a pair of differential amplifiers having said electrode means of opposed pairs of said arms connected to the inputs of respective ones of said amplifiers whereby the outputs of said amplifiers represent the difference signals from each of said opposed pairs.

* * * * *